United States Patent
Yan

(10) Patent No.: US 10,902,754 B2
(45) Date of Patent: Jan. 26, 2021

(54) FLAT PANEL DISPLAY

(71) Applicant: Wuhan China Star Optoelectronics Semiconductor Display Technology Co., Ltd., Hubei (CN)

(72) Inventor: Weinan Yan, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 577 days.

(21) Appl. No.: 15/749,062

(22) PCT Filed: Jan. 12, 2018

(86) PCT No.: PCT/CN2018/072506
§ 371 (c)(1),
(2) Date: Jan. 30, 2018

(87) PCT Pub. No.: WO2019/119574
PCT Pub. Date: Jun. 27, 2019

(65) Prior Publication Data
US 2020/0135062 A1    Apr. 30, 2020

(30) Foreign Application Priority Data
Dec. 18, 2017    (CN) .......................... 2017 1 1368999

(51) Int. Cl.
*H05K 1/11*    (2006.01)
*G09F 9/30*    (2006.01)
(Continued)

(52) U.S. Cl.
CPC .............. *G09F 9/301* (2013.01); *H05K 1/111* (2013.01); *H05K 1/118* (2013.01); *H05K 1/189* (2013.01);
(Continued)

(58) Field of Classification Search
CPC ........ H05K 1/111; H05K 1/118; H05K 1/181; H05K 1/189; H05K 3/362;
(Continued)

(56) References Cited

U.S. PATENT DOCUMENTS

| | | | | |
|---|---|---|---|---|
| 2001/0029118 A1* | 10/2001 | Ota | .......................... | H05K 3/363 439/65 |
| 2006/0065437 A1* | 3/2006 | Yumoto | .............. | G02F 1/13452 174/260 |
| 2006/0223346 A1* | 10/2006 | Fujii | ....................... | G06F 3/041 439/76.2 |
| 2011/0134075 A1* | 6/2011 | Takusa | .................... | G06F 3/044 345/174 |
| 2015/0228706 A1* | 8/2015 | Lee | ..................... | G02F 1/13452 257/88 |

(Continued)

FOREIGN PATENT DOCUMENTS

| | | |
|---|---|---|
| CN | 1521536 A | 8/2004 |
| CN | 101287329 A | 10/2008 |

(Continued)

*Primary Examiner* — Hoa C Nguyen
(74) *Attorney, Agent, or Firm* — Hemisphere Law, PLLC; Zhigang Ma

(57) ABSTRACT

A flat panel display is provided. A first metal joining surface on a display panel includes a first transverse part and a first longitudinal part, and the area occupied by the first transverse part along a transverse direction is larger than the area occupied by the first longitudinal part along the transverse direction. A second metal joining surface on a flexible wiring substrate includes a second transverse part and a second longitudinal part, and the area occupied by the second transverse part along the transverse direction is larger than the area occupied by the second longitudinal part along the transverse direction. The above design can increase the contact area between the first metal joining surface and the second metal joining surface after the expanding offset between the display panel and the flexible wiring substrate occurring in a thermal joining process, to guarantee electrical signals transmitting normally and improve displaying effect.

9 Claims, 7 Drawing Sheets

(51) Int. Cl.
*H05K 1/18* (2006.01)
*H05K 3/36* (2006.01)

(52) U.S. Cl.
CPC ... *H05K 3/361* (2013.01); *H05K 2201/10128* (2013.01)

(58) Field of Classification Search
CPC .......... H05K 2201/09172; H05K 2201/09181; H05K 2201/09372; H05K 2201/09381; H05K 2201/094; H05K 2201/09409; H05K 2201/09418; H05K 2201/09445; H05K 2201/09709; H05K 2201/09727; G06F 3/04164; G09F 9/301
See application file for complete search history.

(56) References Cited

U.S. PATENT DOCUMENTS

2016/0219706 A1\* 7/2016 Jo ........................ H05K 3/361
2018/0373069 A1\* 12/2018 Xing ................... G02F 1/13452

FOREIGN PATENT DOCUMENTS

| CN | 1323998 A | 11/2011 |
| CN | 103094306 A | 5/2013 |
| CN | 204634159 U | 9/2015 |
| CN | 108022514 A | 5/2018 |
| JP | 2009-147025 A | 7/2009 |
| KR | 2003-0050830 A | 6/2003 |

\* cited by examiner

FLAT PANEL DISPLAY

RELATED APPLICATIONS

The present application is a National Phase of International Application Number PCT/CN2018/072506, filed on Jan. 12, 2018, and claims the priority of China Application 201711368999.5, filed on Dec. 18, 2017.

FIELD OF THE DISCLOSURE

The disclosure relates to a display technical field, and more particularly to a flat panel display.

BACKGROUND

In display technical area, the flat panel displays, such as liquid crystal display (LCD) and organic light emitting diode (OLED), have become the mainstream display products in the current market.

Referring to FIG. 1 and FIG. 2, the current flat panel displays commonly include a display panel 100 and a flexible wiring substrate 300. The display panel 100 includes a display area 101 and a bonding area 103 arranged at outside of the display area 101. The flexible wiring substrate 300 and the display panel 100 are joined together at the bonding area 103. The flexible wiring substrate 300 is applied for inputting the electrical signals such as control signals and display signals to the display panel 100 to make the display area 101 of the display panel 100 work.

Further, as shown in FIG. 2, the display panel 100 includes multiple first metal joining surfaces A' in the bonding area 103, and the flexible wiring substrate 300 includes multiple second metal joining surfaces B', with the number equal to the first metal joining surfaces A'. The first metal joining surfaces A' and the second metal joining surfaces B' are joined with electrical connection by heating, thereby to be able to transmit the signals such as control signals and display signals. The first metal joining surfaces A' and the second metal joining surfaces B' are both designed with the same slender rectangle.

The materials and thermal expansivities of the display panel 100 and the flexible wiring substrate 300 are different to each other, so the thermal expanding degrees of them are also different when they are joined, thereby to cause the first metal joining surfaces A' and the second metal joining surfaces B', supposed to be overlapped totally, to be offset to each other. As shown in FIG. 3, the dash line illustrates the first metal joining surfaces A' on the display panel 100, the solid line illustrates the second metal joining surfaces B' on the flexible wiring substrate 300, and the overlapping shaded parts of them are the actual contacting areas between the first metal joining surfaces A' and the second metal joining surfaces B'. Obviously, the offset between the display panel 100 and the flexible wiring substrate 300 due to thermal expanding would reduce the actual contacting area between the first metal joining surfaces A' and the second metal joining surfaces B', thereby to affect the electricity transmitting and the displaying effect.

SUMMARY

One objective of the present invention is to provide a flat panel display for increasing the contact area between the first metal joining surface of the display panel and the second metal joining surface of the flexible wiring substrate, after the thermal expanding offset between the display panel and the flexible wiring substrate occurring in a thermal joining process, to guarantee electrical signals transmitting normally and improve displaying effect.

For achieving the above objective, the present invention provides a flat panel display comprising a display panel and a flexible wiring substrate.

The display panel includes a display area and a bonding area arranged at outside of the display area, and the flexible wiring substrate and the display panel are joined together at the bonding area.

The display panel includes multiple first metal joining surfaces in the bonding area, the flexible wiring substrate includes multiple second metal joining surfaces in an area thereon corresponding to the bonding area, and one the first metal joining surface and one the second metal joining surface corresponding thereto are joined to form an electrical contact.

The first metal joining surface includes a first transverse part arranged transversely and a first longitudinal part connected vertically to the first transverse part, and an area occupied by the first transverse part along a transverse direction is larger than an area occupied by the first longitudinal part along the transverse direction. The second metal joining surface includes a second transverse part arranged transversely and a second longitudinal part connected vertically to the second transverse part, and an area occupied by the second transverse part along the transverse direction is larger than an area occupied by the second longitudinal part along the transverse direction.

Optionally, the first metal joining surface and the second metal joining surface are L-shaped or reverse L-shaped, and the first longitudinal part is connected vertically to an end of the first transverse part, the second longitudinal part is connected vertically to an end of the second transverse part.

Optionally, the first metal joining surface and the second metal joining surface are T-shaped or reverse T-shaped, and the first longitudinal part is connected vertically to a middle of the first transverse part, the second longitudinal part is connected vertically to a middle of the second transverse part.

The expansion coefficient of the flexible wiring substrate is larger than the expansion coefficient of the display panel.

The second metal joining surface is performed by a pre-shrink process relative to the first metal joining surface.

The flexible wiring substrate is a chip on film (COF) or a flexible printed circuit (FPC).

The multiple first metal joining surfaces and the multiple second metal joining surfaces both are arranged in multiple rows. The first longitudinal part of one of two adjacent the first metal joining surfaces in a same row is extending downward, and the first longitudinal part of the other of two adjacent the first metal joining surfaces in the same row is extending upward. The second longitudinal part of one of two adjacent the second metal joining surfaces in a same row is extending downward, and the second longitudinal part of the other of two adjacent the second metal joining surfaces in the same row is extending upward.

The present invention also provides a flat panel display comprising a display panel and a flexible wiring substrate.

The display panel includes a display area and a bonding area arranged at outside of the display area, and the flexible wiring substrate and the display panel are joined together at the bonding area.

The display panel includes multiple first metal joining surfaces in the bonding area, the flexible wiring substrate includes multiple second metal joining surfaces in an area thereon corresponding to the bonding area, and one the first metal joining surface and one the second metal joining surface corresponding thereto are joined to form an electrical contact.

The first metal joining surface and the second metal joining surface have a same shape. The first metal joining surface includes a first transverse part arranged transversely and a first longitudinal part connected vertically to the first transverse part, and an area occupied by the first transverse part along a transverse direction is larger than an area occupied by the first longitudinal part along the transverse direction. The second metal joining surface includes a second transverse part arranged transversely and a second longitudinal part connected vertically to the second transverse part, and an area occupied by the second transverse part along the transverse direction is larger than an area occupied by the second longitudinal part along the transverse direction.

The expansion coefficient of the flexible wiring substrate is larger than the expansion coefficient of the display panel.

The second metal joining surface is performed by a pre-shrink process relative to the first metal joining surface.

The flexible wiring substrate is a chip on film (COF) or a flexible printed circuit (FPC).

The multiple first metal joining surfaces and the multiple second metal joining surfaces both are arranged in multiple rows; wherein the first longitudinal part of one of two adjacent the first metal joining surfaces in a same row is extending downward, and the first longitudinal part of the other of two adjacent the first metal joining surfaces in the same row is extending upward; wherein the second longitudinal part of one of two adjacent the second metal joining surfaces in a same row is extending downward, and the second longitudinal part of the other of two adjacent the second metal joining surfaces in the same row is extending upward.

The advantages of the present invention is as follows. In the flat panel display provided by the present invention, the first metal joining surface on the display panel includes a first transverse part and a first longitudinal part, and the area occupied by the first transverse part along a transverse direction is larger than the area occupied by the first longitudinal part along the transverse direction. The second metal joining surface on the flexible wiring substrate includes a second transverse part and a second longitudinal part, and the area occupied by the second transverse part along the transverse direction is larger than the area occupied by the second longitudinal part along the transverse direction. When the first metal joining surface and the corresponding second metal joining surface are joined by heat to form an electrical contact, the offset error between the first metal joining surface and the second metal joining surface is inevitably occurring due to the thermal expanding of the display panel and the flexible wiring substrate being heated. However, compared to the current technique, the first transverse part of the first metal joining surface and the second transverse part of the second metal joining surface would have more contact area along the transverse direction, for compensating the offset error along the transverse direction, thereby to increase the contact area between the first metal joining surface and the second metal joining surface, to guarantee electrical signals transmitting normally, and to improve displaying effect.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
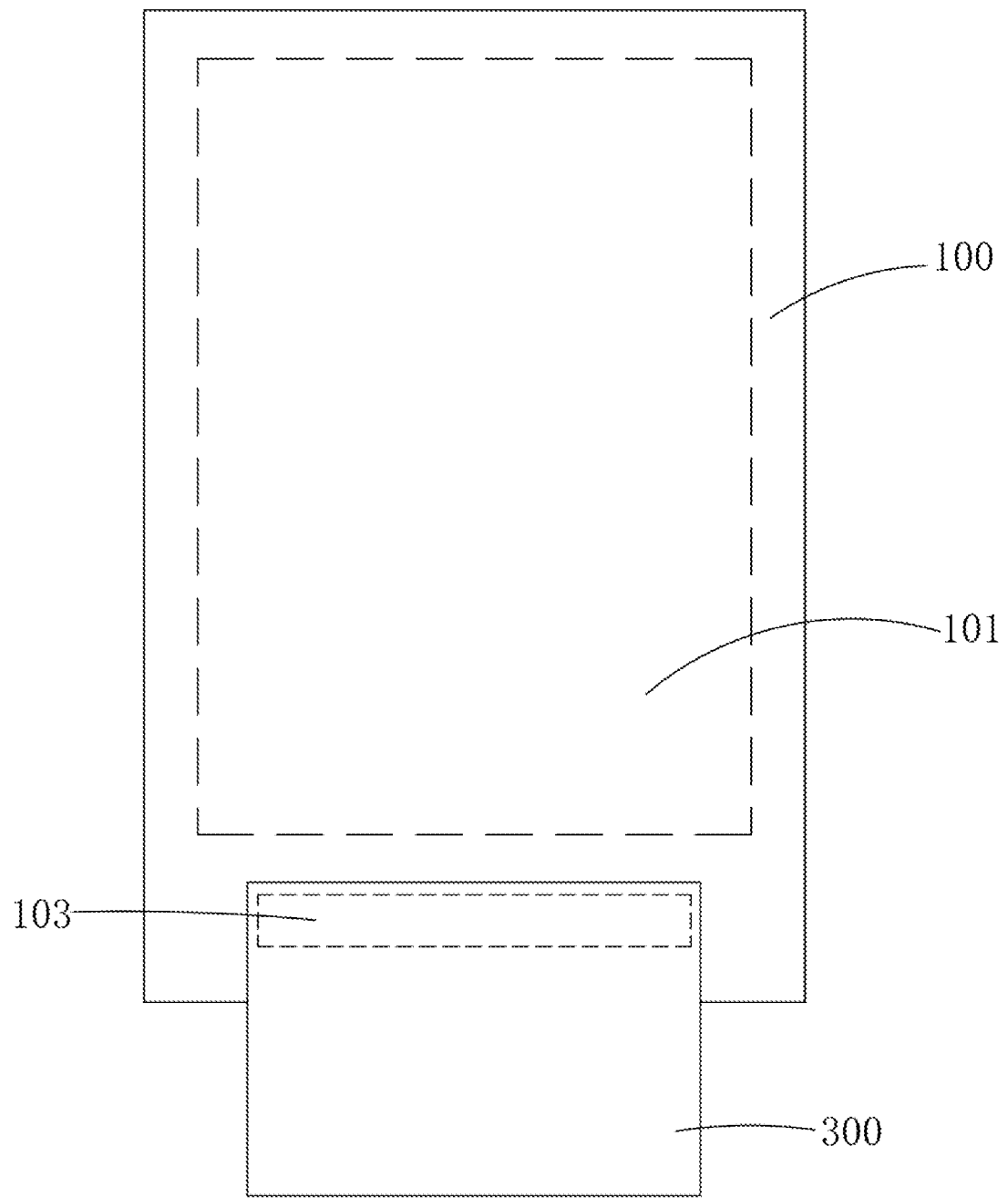
FIG. 1 is a top view of a current flat panel display.
Figure 2:
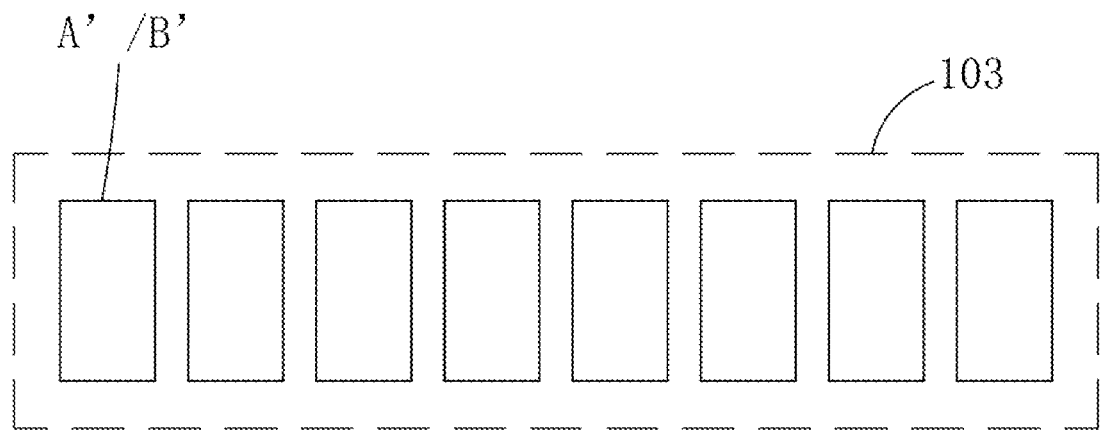
FIG. 2 is a structure view of the bonding area in the current flat panel display.
Figure 3:
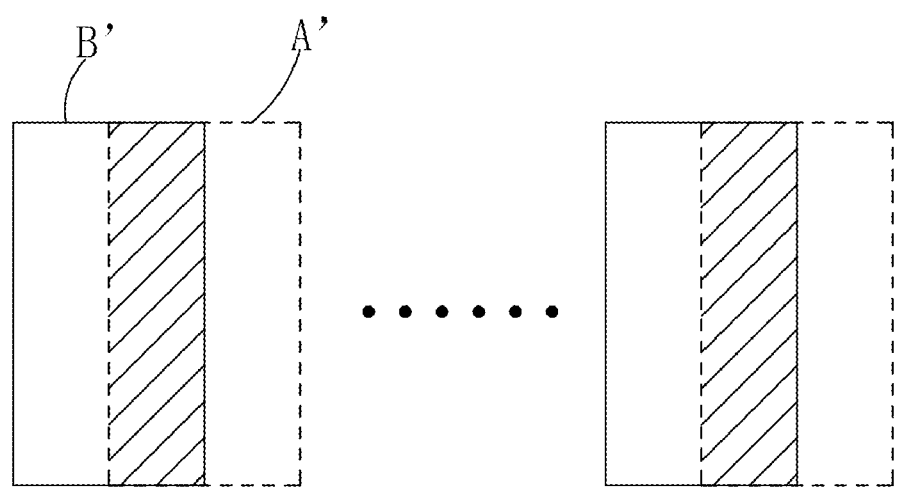
FIG. 3 is a top view of the offset occurring between the first metal joining surface of the display panel and the second metal joining surface of the flexible wiring substrate through a thermal joining procedure in the current flat panel display.

The disclosure will be further described in detail with reference to accompanying drawings and preferred embodiments as follows.

The present invention provides a flat panel display. Please refer to FIG. 4, FIG. 5 and FIG. 6, the flat panel display in the first embodiment of the present invention comprises a display panel 1 and a flexible wiring substrate 3. The display panel 1 may be and not limited to a liquid crystal display (LCD) or an organic light emitting diode (OLED). Preferably, the flexible wiring substrate 3 may be a chip on film (COF) or a flexible printed circuit (FPC). The expansion coefficient of the flexible wiring substrate 3 is larger than the expansion coefficient of the display panel 1.

The display panel 1 includes a display area 11 and a bonding area 13 arranged at outside of the display area 11. The flexible wiring substrate 3 and the display panel 1 are joined together at the bonding area 13. The flexible wiring substrate 3 is applied for inputting the electrical signals such as control signals and display signals to the display panel 1 to make the display area 11 of the display panel 100 work.

Figure 4:
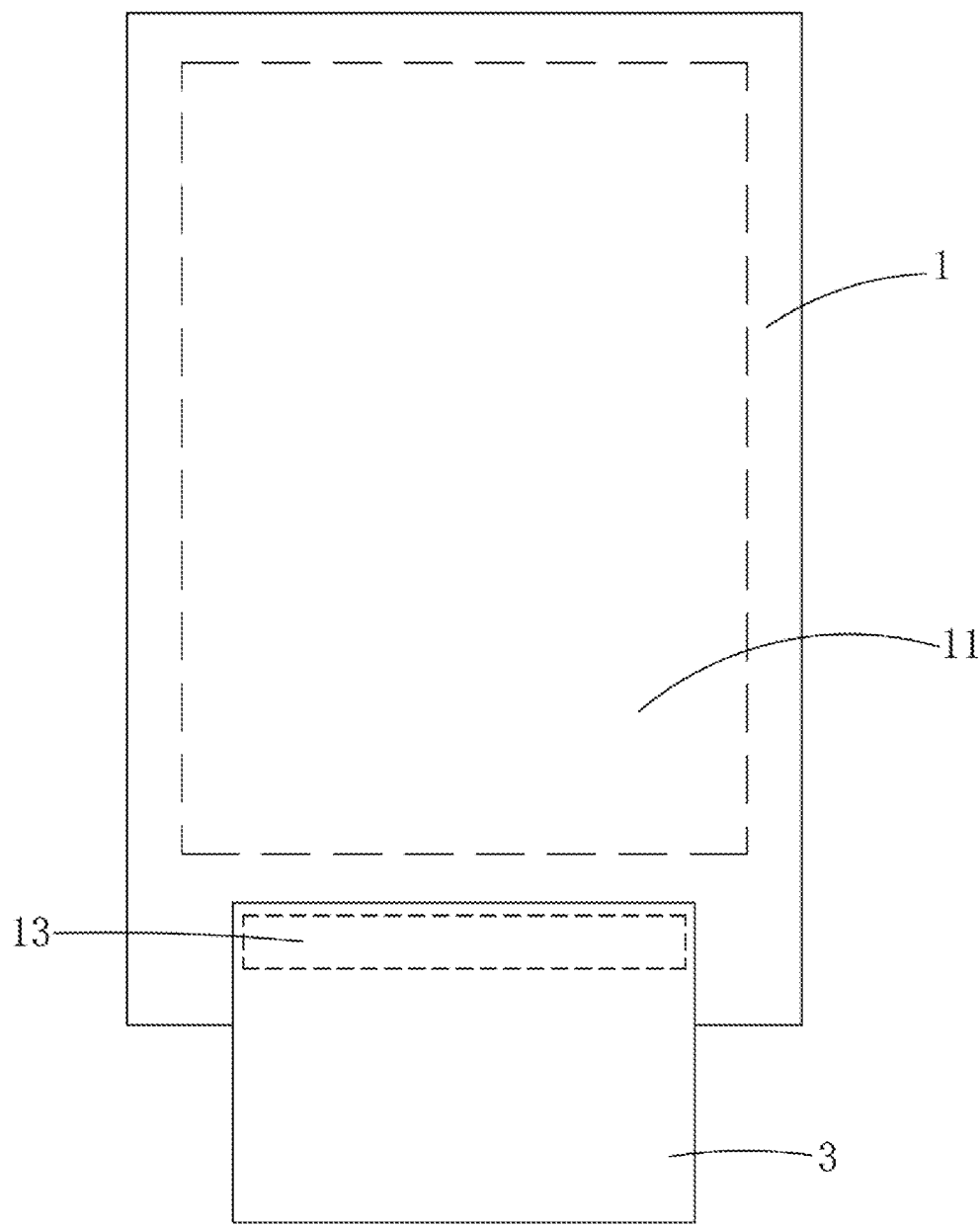
FIG. 4 is a top view of a flat panel display of the present invention.
Figure 5:
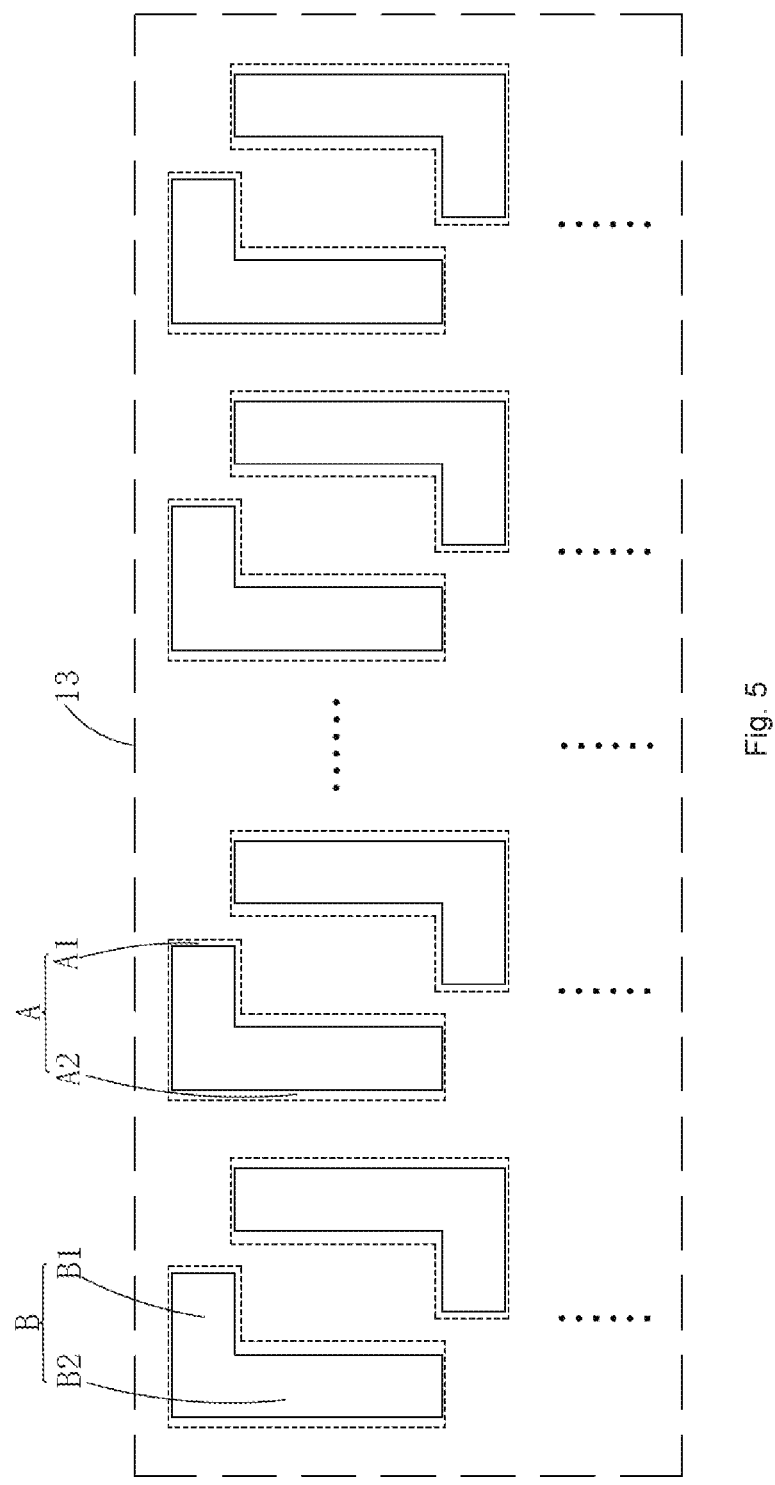
FIG. 5 is a structure view of the bonding area of the current flat panel display in the first embodiment of the present invention.

Referring to FIG. 4 and FIG. 5, the display panel 1 includes multiple first metal joining surfaces A, illustrated by dash lines, in the bonding area 13. The flexible wiring substrate 3 includes multiple second metal joining surfaces B, illustrated by solid lines, with the number equal to the first metal joining surfaces A, in an area on the flexible wiring substrate 3 corresponding to the bonding area 13. One the first metal joining surface A and one the second metal joining surface B corresponding thereto are joined to form an electrical contact by heating.

Compared to the design of the slender rectangle of the first metal joining surfaces and the second metal joining surfaces in current technology, the first metal joining surfaces A and the second metal joining surface B, in the first embodiment, both are L-shaped or reverse L-shaped.

The first metal joining surface A includes a first transverse part A1 arranged transversely and a first longitudinal part A2 connected vertically to an end of the first transverse part A1, and an area occupied by the first transverse part A1 along a transverse direction is larger than an area occupied by the first longitudinal part A2 along the transverse direction.

The second metal joining surface B includes a second transverse part B1 arranged transversely and a second longitudinal part B2 connected vertically to an end of the second transverse part B1, and an area occupied by the second transverse part B1 along the transverse direction is larger than an area occupied by the second longitudinal part B2 along the transverse direction.

Further, as shown in FIG. 5, the multiple first metal joining surfaces A and the multiple second metal joining surfaces B both are arranged in multiple rows. The first longitudinal part A2 of one of two adjacent the first metal joining surfaces A in a same row is extending downward, and the first longitudinal part A2 of the other of two adjacent the first metal joining surfaces A in the same row is extending upward. The second longitudinal part B2 of one of two adjacent the second metal joining surfaces B in a same row is extending downward, and the second longitudinal part B2 of the other of two adjacent the second metal joining surfaces B in the same row is extending upward. This arrangement could make the first transverse parts A1 of two adjacent the first metal joining surfaces A share a portion of the transverse space, and make the second transverse parts B1 of two adjacent the second metal joining surfaces B share a portion of the transverse space, thereby to save the space and be able to form an even joint between the display panel 1 and the flexible wiring substrate 3.

Figure 6:
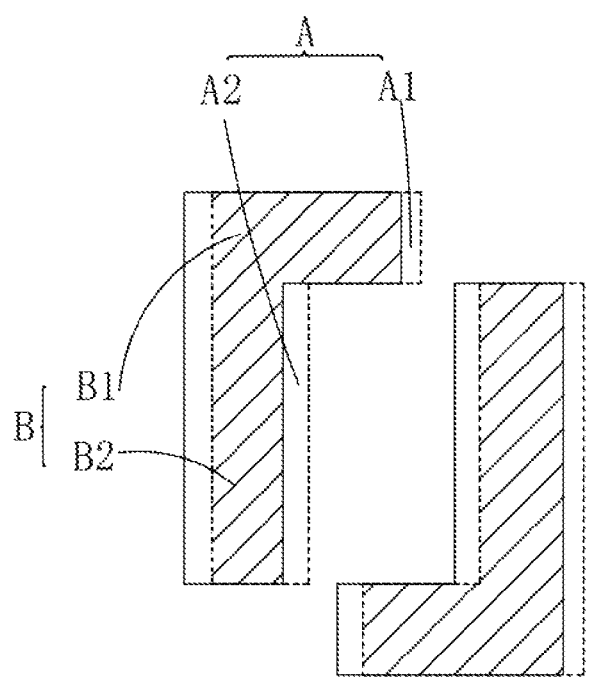
FIG. 6 is a top view of the offset occurring between the first metal joining surface of the display panel and the second metal joining surface of the flexible wiring substrate through a thermal joining procedure in the flat panel display according to the structure of FIG. 5.

Referring to FIG. 5 and FIG. 6, the first metal joining surfaces A and the second metal joining surface B in the first embodiment are both L-shaped or reverse L-shaped, so the area occupied by the first transverse part A1 along the transverse direction is larger than the area occupied by the first longitudinal part A2 along the transverse direction, and the area occupied by the second transverse part B1 along the transverse direction is larger than the area occupied by the second longitudinal part B2 along the transverse direction. When the first metal joining surface A and the corresponding second metal joining surface B are joined by heat to form an electrical contact, the offset error between the first metal joining surface A and the second metal joining surface B is inevitably occurring due to the thermal expanding of the display panel 1 and the flexible wiring substrate 3 being heated. The offset caused by the thermal expanding is primarily occurring along the transverse direction. However, compared to the current technique, the first transverse part A1 of the first metal joining surface A and the second transverse part B1 of the second metal joining surface B would have more contact area along the transverse direction (the actual joint area between the first metal joining surface A and the second metal joining surface B is illustrated by the Slashed area in figures), for compensating the offset error along the transverse direction, thereby to increase the contact area between the first metal joining surface A and the second metal joining surface B, to guarantee electrical signals transmitting normally, and to improve displaying effect.

The expansion coefficient of the flexible wiring substrate 3 is larger than the expansion coefficient of the display panel 1, so the expansion volume of the flexible wiring substrate 3 is larger than that of the display panel 1, thereby to cause the offset of the second metal joining surface B is larger. For increasing the contact area between the first metal joining surface A and the second metal joining surface B after the thermal expanding offset between the display panel 1 and the flexible wiring substrate 3 occurring in a thermal joining process, the second metal joining surface B is performed by a pre-shrink process relative to the first metal joining surface A. Namely, the sizes of each side of the second metal joining surface B are designed to be little smaller than the sizes of each corresponding side of the first metal joining surface A.

Figure 7:
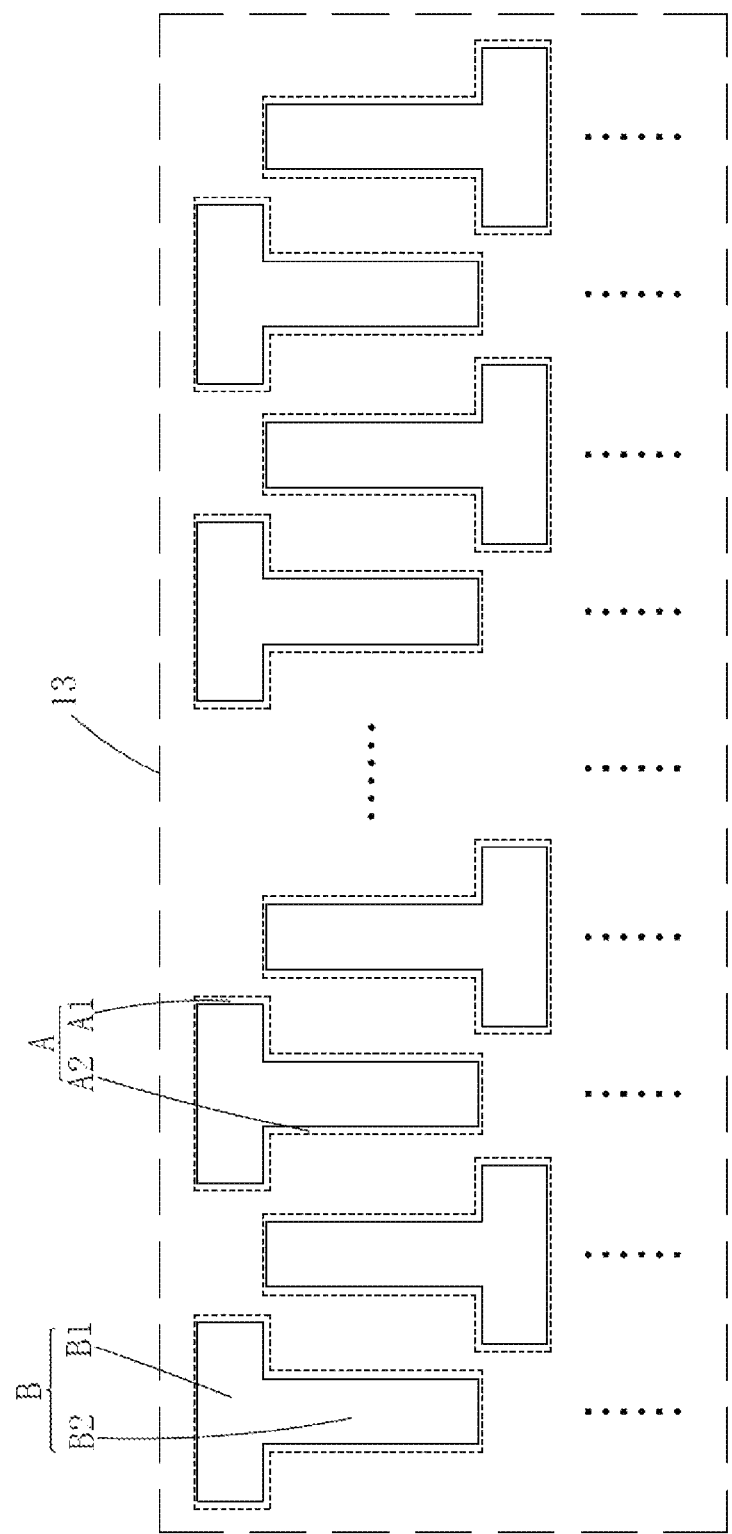
FIG. 7 is a structure view of the bonding area of the current flat panel display in the second embodiment of the present invention.
Figure 8:
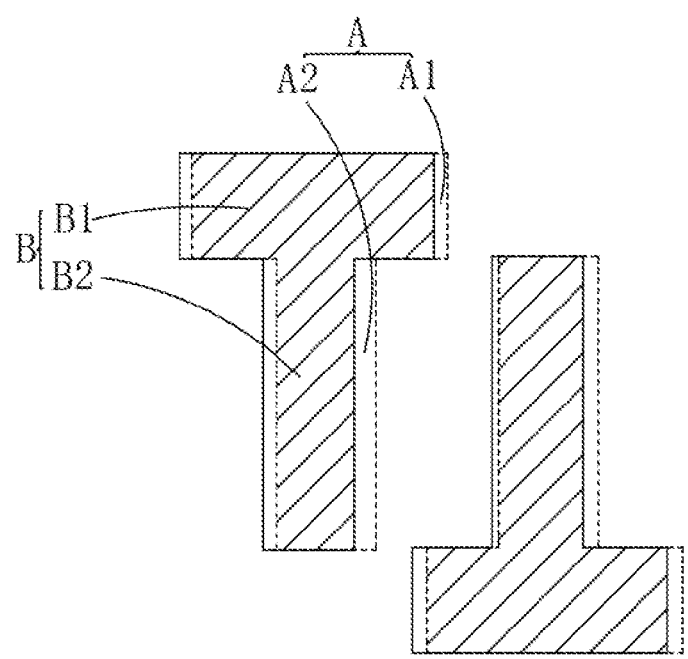
FIG. 8 is a top view of the offset occurring between the first metal joining surface of the display panel and the second metal joining surface of the flexible wiring substrate through a thermal joining procedure in the flat panel display according to the structure of FIG. 7.

Referring to FIG. 4, FIG. 7 and FIG. 8, the first metal joining surfaces A and the second metal joining surface B in the second embodiment are both T-shaped or reverse T-shaped, and the first longitudinal part A2 is connected vertically to a middle of the first transverse part A1 the second longitudinal part B2 is connected vertically to a middle of the second transverse part B1. Other structures are same as illustrated in the first embodiment and not repeated herein. Referring to FIG. 7 and FIG. 8, the first metal joining surfaces A and the second metal joining surface B in the second embodiment are both T-shaped or reverse T-shaped, so the area occupied by the first transverse part A1 along the transverse direction is larger than the area occupied by the first longitudinal part A2 along the transverse direction, and the area occupied by the second transverse part B1 along the transverse direction is larger than the area occupied by the second longitudinal part B2 along the transverse direction. When the first metal joining surface A and the corresponding second metal joining surface B are joined by heat to form an electrical contact, the offset error between the first metal joining surface A and the second metal joining surface B is inevitably occurring due to the thermal expanding of the display panel 1 and the flexible wiring substrate 3 being heated. The offset caused by the thermal expanding is primarily occurring along the transverse direction. However, compared to the current technique, the first transverse part A1 of the first metal joining surface A and the second transverse part B1 of the second metal joining surface B would have more contact area along the transverse direction (the actual joint area between the first metal joining surface A and the second metal joining surface B is illustrated by the Slashed area in figures), for compensating the offset error along the transverse direction, thereby to increase the contact area between the first metal joining surface A and the second metal joining surface B, to guarantee electrical signals transmitting normally, and to improve displaying effect.

The expansion coefficient of the flexible wiring substrate 3 is larger than the expansion coefficient of the display panel 1, so the expansion volume of the flexible wiring substrate 3 is larger than that of the display panel 1, thereby to cause the offset of the second metal joining surface B is larger. For increasing the contact area between the first metal joining surface A and the second metal joining surface B after the thermal expanding offset between the display panel 1 and the flexible wiring substrate 3 occurring in a thermal joining process, the second metal joining surface B is performed by a pre-shrink process relative to the first metal joining surface A. Namely, the sizes of each side of the second metal joining surface B are designed to be little smaller than the sizes of each corresponding side of the first metal joining surface A.

The advantages of the present invention is as follows. In the flat panel display provided by the present invention, the first metal joining surface on the display panel includes a first transverse part and a first longitudinal part, and the area occupied by the first transverse part along a transverse direction is larger than the area occupied by the first longitudinal part along the transverse direction. The second metal joining surface on the flexible wiring substrate includes a second transverse part and a second longitudinal part, and the area occupied by the second transverse part along the transverse direction is larger than the area occupied by the second longitudinal part along the transverse direction. When the first metal joining surface and the corresponding second metal joining surface are joined by heat to form an electrical contact, the offset error between the first metal joining surface and the second metal joining surface is inevitably occurring due to the thermal expanding of the display panel and the flexible wiring substrate being heated. However, compared to the current technique, the first transverse part of the first metal joining surface and the second transverse part of the second metal joining surface would have more contact area along the transverse direction, for compensating the offset error along the transverse direction, thereby to increase the contact area between the first metal joining surface and the second metal joining surface, to guarantee electrical signals transmitting normally, and to improve displaying effect.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A flat panel display, comprising:
    a display panel;
    a flexible wiring substrate;
    wherein the display panel includes a display area and a bonding area arranged at outside of the display area, and the flexible wiring substrate and the display panel are joined together at the bonding area;
    wherein the display panel includes multiple first metal joining surfaces in the bonding area, the flexible wiring substrate includes multiple second metal joining surfaces in an area thereon corresponding to the bonding area, and one the first metal joining surface and one the second metal joining surface corresponding thereto are joined to form an electrical contact;
    wherein the first metal joining surface and the second metal joining surface have a same shape;
    wherein the first metal joining surface includes a first transverse part arranged transversely and a first longitudinal part connected vertically to the first transverse part, and an area occupied by the first transverse part along a transverse direction is larger than an area occupied by the first longitudinal part along the transverse direction; and
    wherein the second metal joining surface includes a second transverse part arranged transversely and a second longitudinal part connected vertically to the second transverse part, and an area occupied by the second transverse part along the transverse direction is larger than an area occupied by the second longitudinal part along the transverse direction;
    wherein the multiple first metal joining surfaces and the multiple second metal joining surfaces both are arranged in multiple rows; wherein the first longitudinal part of one of two adjacent the first metal joining surfaces in a same row is extending downward, and the first longitudinal part of the other of two adjacent the first metal joining surfaces in the same row is extending upward; wherein the second longitudinal part of one of two adjacent the second metal joining surfaces in a same row is extending downward, and the second longitudinal part of the other of two adjacent the second metal joining surfaces in the same row is extending upward.

2. The flat panel display according to claim 1, wherein the first metal joining surface and the second metal joining surface are L-shaped or reverse L-shaped, and the first longitudinal part is connected vertically to an end of the first transverse part, the second longitudinal part is connected vertically to an end of the second transverse part.

3. The flat panel display according to claim 1, wherein the first metal joining surface and the second metal joining surface are T-shaped or reverse T-shaped, and the first longitudinal part is connected vertically to a middle of the first transverse part, the second longitudinal part is connected vertically to a middle of the second transverse part.

4. The flat panel display according to claim 1, wherein an expansion coefficient of the flexible wiring substrate is larger than an expansion coefficient of the display panel.

5. The flat panel display according to claim 4, wherein the second metal joining surface is performed by a pre-shrink process relative to the first metal joining surface.

6. The flat panel display according to claim 4, wherein the flexible wiring substrate is a chip on film (COF) or a flexible printed circuit (FPC).

7. A flat panel display, comprising:
    a display panel;
    a flexible wiring substrate;
    wherein the display panel includes a display area and a bonding area arranged at outside of the display area, and the flexible wiring substrate and the display panel are joined together at the bonding area;
    wherein the display panel includes multiple first metal joining surfaces in the bonding area, the flexible wiring substrate includes multiple second metal joining surfaces in an area thereon corresponding to the bonding area, and one the first metal joining surface and one the second metal joining surface corresponding thereto are joined to form an electrical contact;
    wherein the first metal joining surface and the second metal joining surface have a same shape;
    wherein the first metal joining surface includes a first transverse part arranged transversely and a first longitudinal part connected vertically to the first transverse part, and an area occupied by the first transverse part along a transverse direction is larger than an area occupied by the first longitudinal part along the transverse direction;
    wherein the second metal joining surface includes a second transverse part arranged transversely and a second longitudinal part connected vertically to the second transverse part, and an area occupied by the second transverse part along the transverse direction is larger than an area occupied by the second longitudinal part along the transverse direction;
    wherein an expansion coefficient of the flexible wiring substrate is larger than an expansion coefficient of the display panel;
    wherein the second metal joining surface is performed by a pre-shrink process relative to the first metal joining surface;

wherein the flexible wiring substrate is a chip on film (COF) or a flexible printed circuit (FPC); and wherein the multiple first metal joining surfaces and the multiple second metal joining surfaces both are arranged in multiple rows; wherein the first longitudinal part of one of two adjacent the first metal joining surfaces in a same row is extending downward, and the first longitudinal part of the other of two adjacent the first metal joining surfaces in the same row is extending upward; wherein the second longitudinal part of one of two adjacent the second metal joining surfaces in a same row is extending downward, and the second longitudinal part of the other of two adjacent the second metal joining surfaces in the same row is extending upward.

8. The flat panel display according to claim 7, wherein the first metal joining surface and the second metal joining surface are L-shaped or reverse L-shaped, and the first longitudinal part is connected vertically to an end of the first transverse part, the second longitudinal part is connected vertically to an end of the second transverse part.

9. The flat panel display according to claim 7, wherein the first metal joining surface and the second metal joining surface are T-shaped or reverse T-shaped, and the first longitudinal part is connected vertically to a middle of the first transverse part, the second longitudinal part is connected vertically to a middle of the second transverse part.

* * * * *